(12) United States Patent
Ueno et al.

(10) Patent No.: US 8,338,901 B2
(45) Date of Patent: Dec. 25, 2012

(54) SOLID-STATE IMAGING DEVICE

(75) Inventors: Risako Ueno, Tokyo (JP); Kazuhiro Suzuki, Tokyo (JP); Hideyuki Funaki, Tokyo (JP); Yoshinori Iida, Tokyo (JP); Tatsuo Shimizu, Tokyo (JP); Masamichi Suzuki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 111 days.

(21) Appl. No.: 12/875,534

(22) Filed: Sep. 3, 2010

(65) Prior Publication Data

US 2011/0175187 A1 Jul. 21, 2011

(30) Foreign Application Priority Data

Jan. 20, 2010 (JP) .................................... 2010-10104

(51) Int. Cl.
*H01L 27/146* (2006.01)
(52) U.S. Cl. .................... 257/437; 257/432; 257/E27.13
(58) Field of Classification Search .................. 257/437, 257/432, 292, E31.11, E27.13, E31.001, 257/E31.127
See application file for complete search history.

(56) References Cited

U.S. PATENT DOCUMENTS

| | | | |
|---|---|---|---|
| 2008/0199671 A1* | 8/2008 | Miyagi et al. | 428/216 |
| 2008/0303416 A1* | 12/2008 | Fery et al. | 313/504 |
| 2010/0078744 A1* | 4/2010 | Wano et al. | 257/432 |

FOREIGN PATENT DOCUMENTS

| | | |
|---|---|---|
| JP | 2005-20024 | 1/2005 |
| JP | 2008-244243 | 10/2008 |
| JP | 2009-176950 | 8/2009 |

OTHER PUBLICATIONS

U.S. Appl. No. 12/875,546, filed Sep. 3, 2010, Iida, et al.
U.S. Appl. No. 12/875,809, filed Sep. 3, 2010, Iida, et al.
Office Action issued Jan. 20, 2012 in Japan Application No. 2010-010104 (With English Translation).

* cited by examiner

*Primary Examiner* — Benjamin Sandvik
*Assistant Examiner* — Whitney T Moore
(74) *Attorney, Agent, or Firm* — Oblon, Spivak, McClelland, Maier & Neustadt, L.L.P.

(57) ABSTRACT

Certain embodiments provide a solid-state imaging device including: a photoelectric converting unit that includes a semiconductor layer of a second conductivity type provided on a semiconductor substrate of a first conductivity type, converts incident light entering a first surface of the semiconductor substrate into signal charges, and stores the signal charges; a readout circuit that reads the signal charges stored by the photoelectric converting unit; an antireflection structure that is provided on the first surface of the semiconductor substrate to cover the semiconductor layer of the photoelectric converting unit, includes a fixed charge film that retains fixed charges being non-signal charges, and prevents reflection of the incident light; and a hole storage region that is provided between the photoelectric converting unit and the antireflection structure, and stores holes being non-signal charges.

11 Claims, 8 Drawing Sheets

SOLID-STATE IMAGING DEVICE

CROSS-REFERENCE TO RELATED APPLICATION

This application is based upon and claims the benefit of priority from prior Japanese Patent Application No. 2010-10104 filed on Jan. 20, 2010 in Japan, the entire contents of which are incorporated herein by reference.

FIELD

Embodiments described herein relate to a solid-state imaging device.

BACKGROUND

In recent years, as a technique for increasing an aperture ratio greatly, it has been suggested that a back-illuminated type structure on which light is incident from a second surface opposite from interconnect layers can be applied to CMOS image sensors. In the back-illuminated type structure, the interconnect layers, transistors for reading, and the like are formed on a first surface of a semiconductor substrate. A photodiode array including photodiodes that photoelectrically convert light into signals is formed on the second opposite from the first surface. The second surface is the illuminated surface. Color filters and the like that divide incident light wavelengths into wavelength ranges such as R (red), G (green), and B (blue), for example, are formed on the illuminated surface, and a microlens for gathering light is further formed on the color filters and the like.

The photodiode array formed on the illuminated surface includes photodiodes formed with silicon single crystals, but a large number of defect levels exist at the interface between silicon forming the photodiodes and a silicon oxide film formed over the photodiodes. Due to the defect levels, electrons that are not derived from signals generated through photoelectric conversion are generated by thermal excitation or the like, and dark noise components called "dark current" increase.

To reduce the dark current, a transparent electrode is formed on the illuminated surface, and biasing is performed by applying a negative voltage. In this manner, holes are stored on the interface, and electron excitation at the interface can be restrained. In such a case, however, a negative power supply is required, and the device becomes complicated.

DETAILED DESCRIPTION

Certain embodiments provide a solid-state imaging device including: a photoelectric converting unit that includes a semiconductor layer of a second conductivity type provided on a semiconductor substrate of a first conductivity type, converts incident light entering a first surface of the semiconductor substrate into signal charges, and stores the signal charges; a readout circuit that reads the signal charges stored by the photoelectric converting unit; an antireflection structure that is provided on the first surface of the semiconductor substrate to cover the semiconductor layer of the photoelectric converting unit, includes a fixed charge film that retains fixed charges being non-signal charges, and prevents reflection of the incident light; and a hole storage region that is provided between the photoelectric converting unit and the antireflection structure, and stores holes being non-signal charges.

Hereafter, solid-state imaging devices according to the embodiments will be described more specifically with reference to the drawings.

FIRST EMBODIMENT

Figure 1:
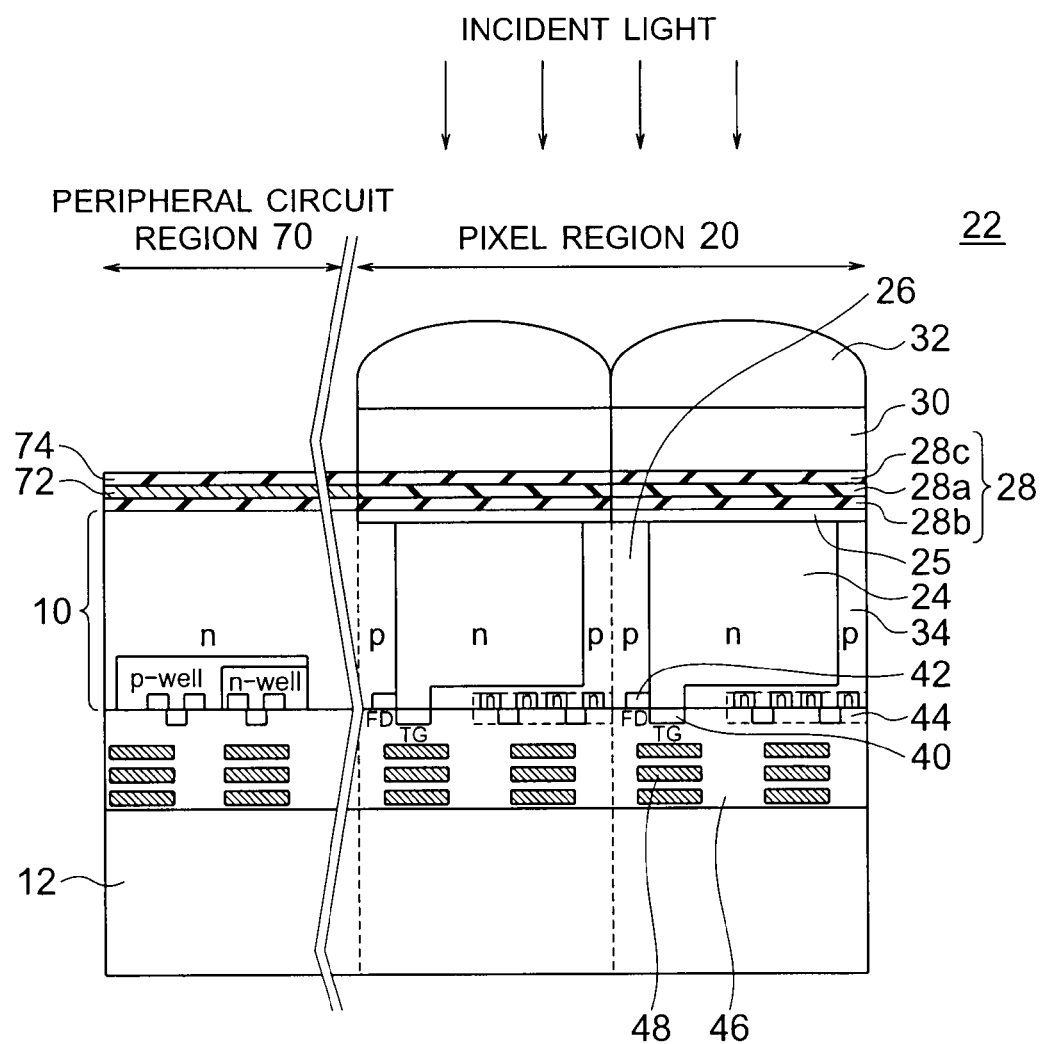
FIG. 1 is a cross-sectional view of a solid-state imaging device according to a first embodiment.
Figure 2:
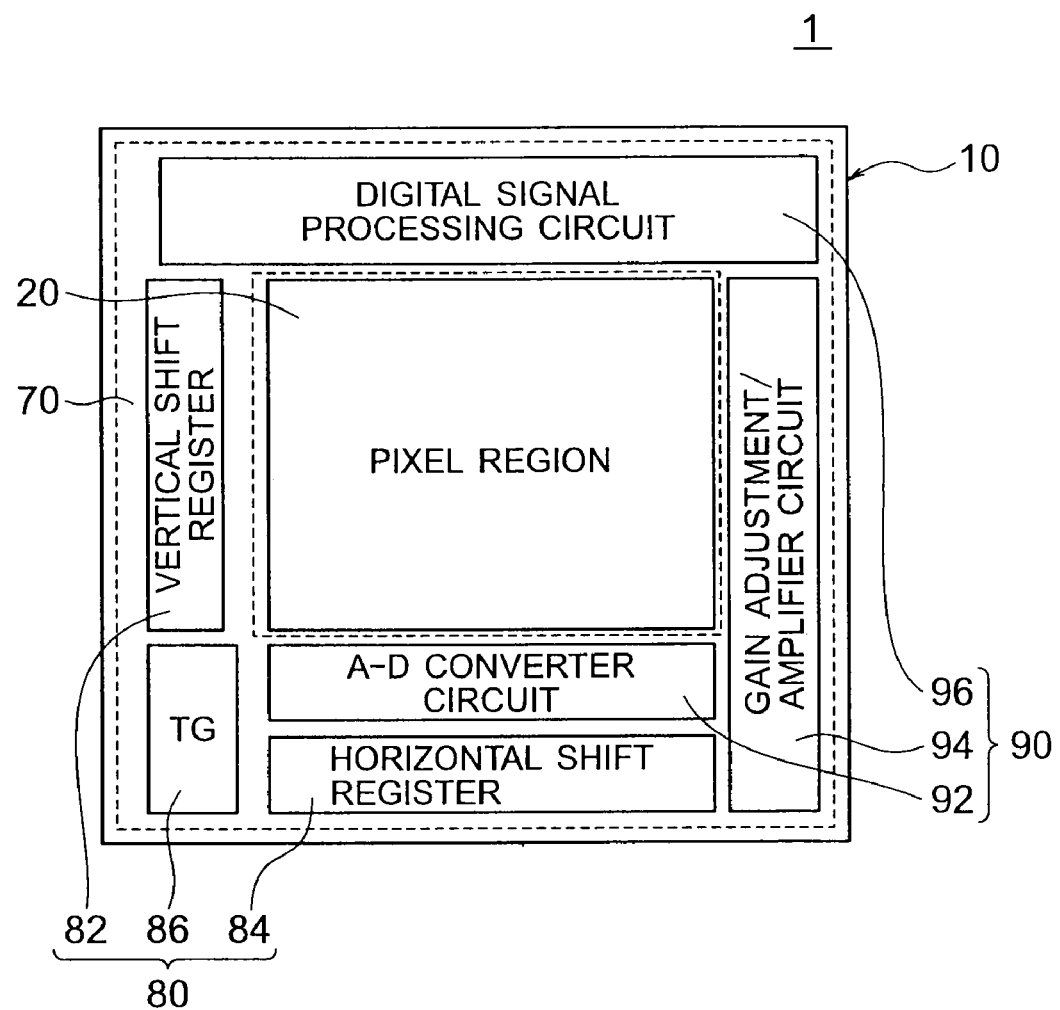
FIG. 2 shows a planar layout of each solid-state imaging device according to the first embodiment and a second embodiment.

A solid-state imaging device according to a first embodiment will be described. FIG. 1 is a cross-sectional view of the solid-state imaging device of the first embodiment as a solid-state imaging device of a back-illuminated type, and FIG. 2 shows a planar layout of the solid-state imaging device. The planar layout shown in FIG. 2 can also be used as a planar layout of a surface-illuminated type solid-state imaging device.

The solid-state imaging device 1 of the first embodiment includes a pixel region 20 and a peripheral circuit region 70 that are formed on a semiconductor substrate (a silicon substrate, for example) 10. Plurality of pixels 22 that are arranged in a two-dimensional array are provided in the pixel region 20, and each of the pixels 22 has a photodiode, for example, as a photoelectric conversion element. A drive circuit unit 80 that drives each pixel in the pixel region 20, and a signal processing circuit unit 90 that processes signals that are output from the pixel region 20 are provided in the peripheral circuit region 70. The drive circuit unit 80 includes a vertical selection circuit (a vertical shift register circuit) 82 that sequentially selects pixels to be driven, for example, in units of a horizontal line (row) in the vertical direction, a horizontal selection circuit (a horizontal shift register circuit) 84 that sequentially selects the pixels in units of a column, and a TG (timing generator) circuit 86 that drives those selection circuits with various kinds of pulses. The signal processing circuit unit 90 includes an analog-digital converter circuit (ADC) 92 that converts analog electrical signals output from the respective pixels into digital signals, a gain adjustment/amplifier circuit 94 that performs gain adjustments and amplifying operations, and a digital signal processing circuit 96 that performs corrections and the like on digital signals.

Each of the pixels (unit pixels) 22 in the pixel region 20 includes an n-type diffusion layer 24 that stores signal charges (signal electrons in this embodiment), a p-type region 26 that is adjacent to the n-type diffusion layer 24, an antireflection structure 28, a color filter 30, a microlens 32, and a pixel separation region 34. The n-type diffusion layer 24 and the p-type region 26 constitute a pn photodiode (a photoelectric conversion unit) that photoelectrically converts incident light.

The antireflection structure 28 includes a negative fixed charge layer 28a that holds negative fixed charges. The antireflection structure 28 may also include insulating layers 28b and 28c that are provided above and below the fixed charge layer 28a, so as to sandwich the fixed charge layer 28a. This fixed charge layer 28a is provided to cover at least the n-type diffusion layer 24 of the pn photodiode (the photoelectric conversion unit). In the first embodiment, the fixed charge layer 28a is provided to cover each corresponding pixel. Since the fixed charge layer 28a is provided in the antireflection structure 28, a hole storage region 25 is formed on a light incidence side of the n-type diffusion layer 24 which incident light enters. This antireflection structure 28 will be described later in detail.

An n-channel MOSFET and a p-channel MOSFET for processing analog and digital signals are formed in the peripheral circuit region 70 as needed. Also, a light shielding layer 72 is provided to prevent incident light from entering the peripheral circuits. The light shielding film 72 is formed with a metal layer made of titanium, aluminum, or the like. However, any other material may be used, as long as it does not transmit a visible light range (400 nm through 800 nm in wavelength). A passivation layer 74 for protection is further provided on the light shielding layer 72.

A readout circuit that reads signal electrons is provided on a portion of the semiconductor substrate on the opposite side from a side on which the antireflection structure 28 is provided (a light incidence side). A transfer transistor 40, a floating diffusion layer 42, and a transistor group 44 including an amplification transistor, a reset transistor, and an address transistor are provided in this readout circuit for each unit pixel. The signal electrons stored in the n-type diffusion layer 24 through photoelectric conversions are transferred from the transfer transistor 40 to the floating diffusion layer 42. The floating diffusion layer 42 is connected to the gate of the amplification transistor, so that the signal electrons are amplified and are output. The address transistor controls the timing to transmit the voltage that is output from the amplification transistor to a vertical signal line (not shown). The reset transistor resets the potentials of the floating diffusion layer 42 and the amplification transistor to the initial state observed prior to the storage of signal electrons. The transfer transistor 40 and the transistor group 44 are covered with an interlayer insulating layer 46, and multilayer interconnects 48 including the vertical signal line are provided in the interlayer insulating layer 46. A supporting substrate 12 is provided on the opposite side of the interlayer insulating layer 46 from the semiconductor substrate 10.

Figure 3:
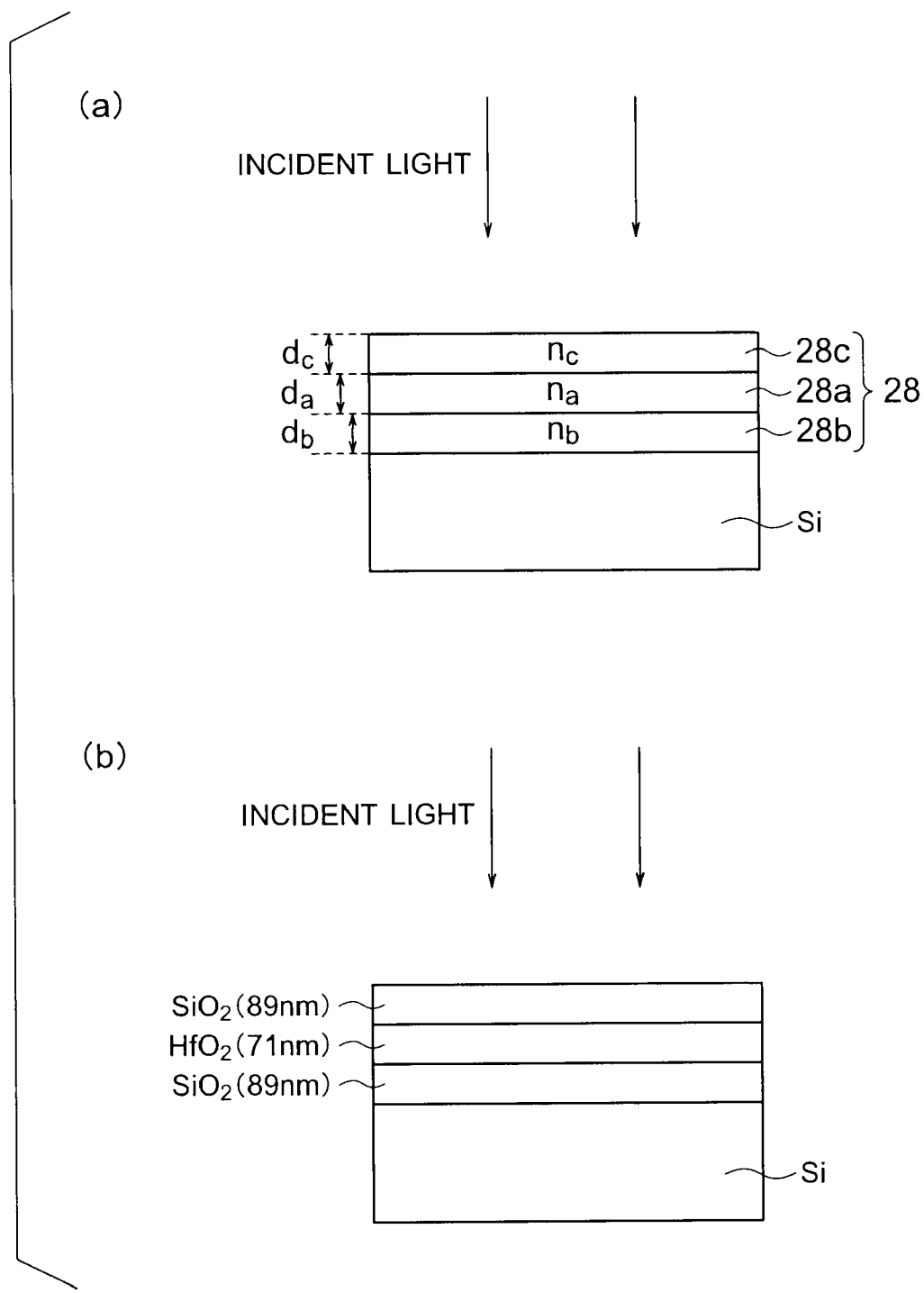
FIGS. 3(a) and 3(b) are schematic views for explaining an antireflection structure.

Next, the antireflection structure 28 will be described. In this embodiment, the antireflection structure 28 includes the fixed charge layer 28a and the insulating layers 28b and 28c provided above and below the fixed charge layer 28a so as to sandwich the fixed charge layer 28a, as shown in FIG. 3(a). The antireflection structure 28 has a three-layer stack structure of the insulating layer 28b, the fixed charge film 28a, and the insulating layer 28c. As an example of the most fundamental structure to provide an antireflection function in each of the layers of the stack structure, the appropriate conditions for light beams to enter vertically will be described. In order for each layer 28i (i=a, b, c) to function as an antireflection layer, the layer thickness $d_i$ of each layer having a refractive index $n_i$ depending on the wavelength should satisfy the relationship expressed by the following equation (1) with respect to the incident wavelength (the wavelength $\lambda_0$ in vacuum):

$$n_i \times d_i = \frac{1}{4} \times \lambda_0 \quad (1)$$

The following is a description of the layer thickness structure of the antireflection structure 28 observed when the green wavelength (550 nm in wavelength) that occupies ½ of the Bayer array in a color filter and makes the largest contribution to the luminance signal sensitivity is used in calculations. The refractive index of each layer 28i when the wavelength is 550 nm is used in calculations. Silicon oxide ($SiO_2$ (the refractive index $n_b = n_c = 1.55$)) is used as the insulating layers 28b and 28c provided above and below the fixed charge layer 28a, and a layer formed by adding the later described additive element to Hafnia ($HfO_2$) is used as the fixed charge layer 28a (in this embodiment, the refractive index of the parent material $HfO_2$: $n_a = 1.93$). The layer thickness of each layer 28i functioning as an antireflection layer is 88.9 nm in the case of $SiO_2$, and is 71.3 nm in the case of $HfO_2$, as shown in FIG. 3(b). Where silicon nitride ($Si_3N_4$ ($N_a' = 2.02$)) is used as the fixed charge layer 28a, the layer thickness should be 68.0 nm.

The structure of each film is not limited to the above described conditions, but may be a structure that can reduce the overall reflection in the entire visible light wavelength range as a result of multiple reflections from each layer. Such a structure can be formed with the use of commercially-available optical simulation software where the refractive index and the layer thickness structure of each layer are virtually set as described above. Also, where the refractive index of the $HfO_2$ layer varies due to the addition of the additive material to the $HfO_2$ layer, it is possible to cope with the variation by optimizing the respective layer thicknesses through the above calculations.

As for the charge amount of the fixed charge layer 28a, it has become apparent from calculations that, when the area density of fixed charges becomes equal to $1 \times 10^{12}$ $cm^{-2}$ or higher, holes are stored on the illuminated surface, interface depletion is prevented, and dark current is effectively reduced. When the area density of fixed charges is $1 \times 10^{12}$ $cm^{-2}$, the density of stored holes is approximately $1 \times 10^{17}$ $cm^{-3}$. Where the area density of fixed charges is higher than $1 \times 10^{12}$ $cm^{-2}$, holes are stored in accordance with the area density of fixed charges, and interface depletion can be prevented. The material of the fixed charge layer 28a will be described later in detail. The material of the insulating layers 28b and 28c is preferably $SiO_2$, but some other material may be used as long as it transmits visible light wavelengths and has insulating properties.

Figure 4:
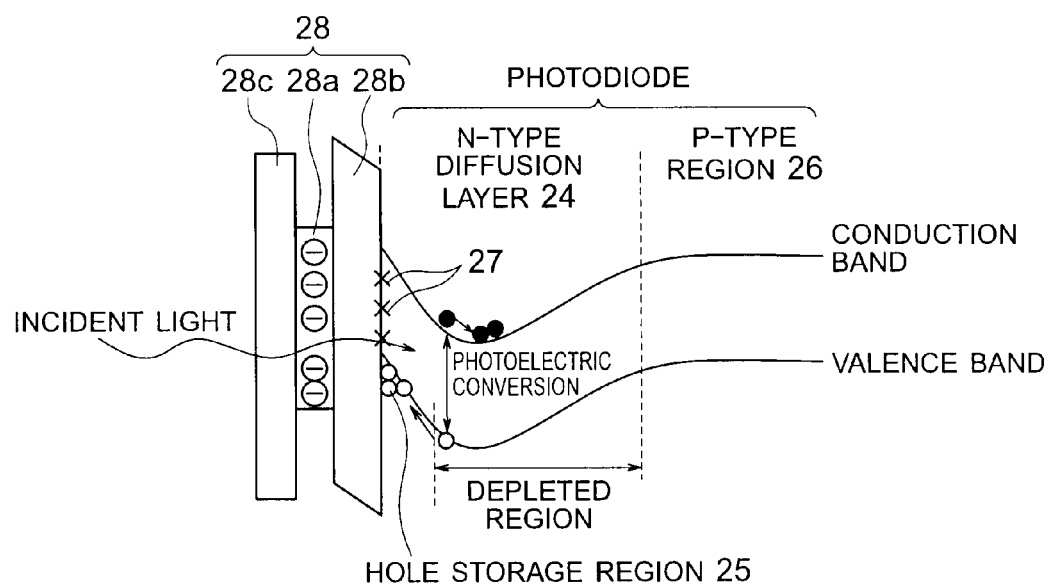
FIG. 4 is a schematic view for explaining the potential formed by a fixed charge layer.

Next, the formation of the hole storage region 25 by the antireflection structure 28 and its role will be described. FIG. 4 shows the potential formed by the antireflection structure 28 having the fixed charge layer 28a. The insulating layer 28b, the fixed charge layer 28a, and the insulating layer 28c are stacked in this order on the light incidence side of the photodiode made of silicon. The potential formed by the fixed charge layer 28a forms the silicon that forms the photodiode, and the hole storage region 25 that stores holes at the interface of the insulating layer adjacent to the silicon. This hole storage region 25 prevents depletion of the surrounding area of the interface. A defect energy level 27 generated by regular crystal defects and the like exists in the interface, and electrons to be dark current noise components are generated due to thermal excitation via the defect level. However, by virtue of the hole storage region 25, the dark current noise can be effectively reduced by promptly recombining the electrons to be the dark current noise components with the holes of the hole storage region 25. In FIG. 4, white circles represent holes, and black circles represent electrons.

The stack structure of the antireflection structure 28 can introduce more light into the photodiode to prevent reflection of incident light, and is effective in improving the sensitivity.

SECOND EMBODIMENT

Figure 5:
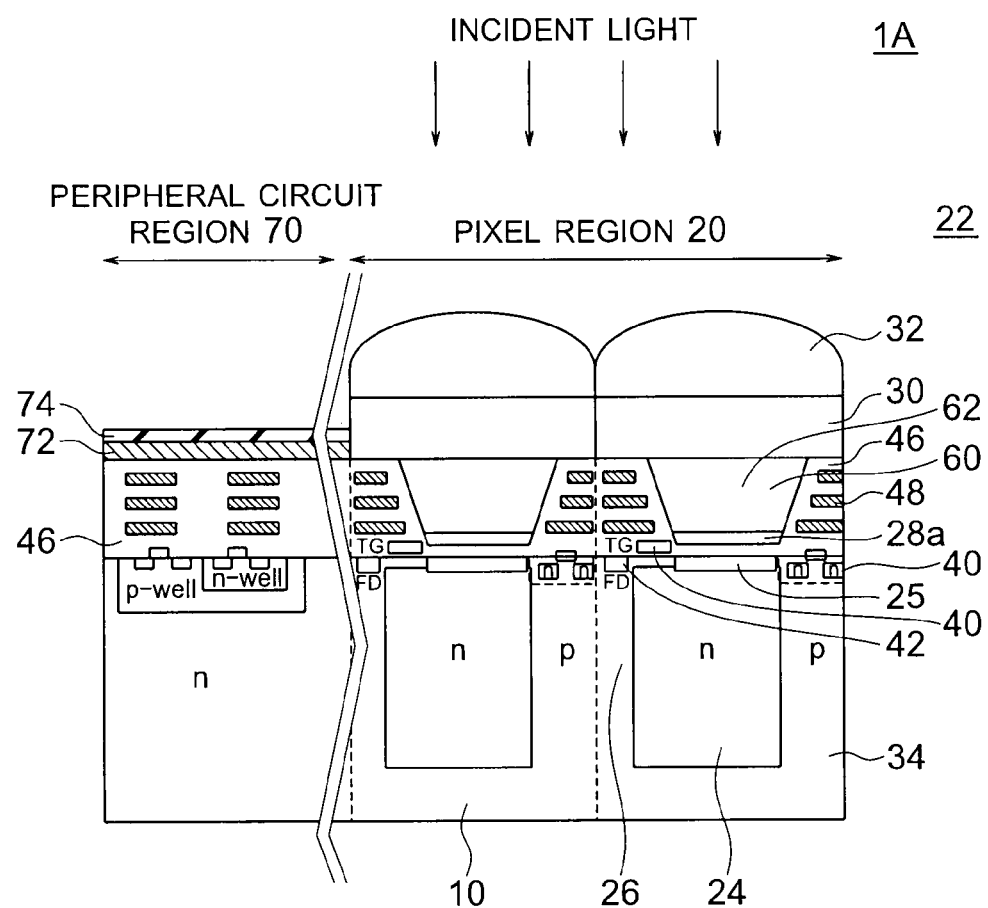
FIG. 5 is a cross-sectional view of a solid-state imaging device according to the second embodiment.

FIG. 5 shows a solid-state imaging device according to a second embodiment. This solid-state imaging device 1A of the second embodiment is a surface-illuminated type solid-state imaging device. A cross section of the solid-state imaging device 1A is shown in FIG. 5, and its planar layout is shown in FIG. 2.

The solid-state imaging device 1A of the second embodiment includes a pixel region 20 and a peripheral circuit region 70 that are formed on a semiconductor substrate (a silicon substrate, for example) 10. As in the first embodiment, pixels 22 that are arranged in a two-dimensional array are provided in the pixel region 20, and each of the pixels 22 has a photodiode as a photoelectric conversion element, for example. Also, as in the first embodiment, a drive circuit unit 80 that drives each pixel in the pixel region 20, and a signal processing circuit unit 90 that processes signals that are output from the pixel region 20 are provided in the peripheral circuit region 70. The drive circuit unit 80 includes a vertical selection circuit (a vertical shift register circuit) 82 that sequentially selects the pixels to be driven in units of a horizontal line (row) in the vertical direction, a horizontal selection circuit (a horizontal shift register circuit) 84 that sequentially selects the pixels in units of the column, and a TG (timing generator) circuit 86 that drives those selection circuits with various kinds of pulses. The signal processing circuit unit 90 includes an analog-digital converter circuit (ADC) 92 that converts analog electrical signals output from the respective pixels into digital signals, a gain adjustment/amplifier circuit 94 that performs gain adjustments and amplifying operations, and a digital signal processing circuit 96 that performs corrections and the like on digital signals.

Each of the pixels (unit pixels) 22 in the pixel region 20 includes an n-type diffusion layer 24 that stores signal charges (signal electrons in this embodiment), a p-type region 26 that is adjacent to the n-type diffusion layer 24, an antireflection structure 28, a color filter 30, a microlens 32, and a pixel separation region 34. The n-type diffusion layer 24 and the p-type region 26 constitute a pn photodiode that photoelectrically converts incident light.

An n-channel MOSFET and a p-channel MOSFET for processing analog and digital signals are formed in the peripheral circuit region 70 as needed, as in the first embodiment. Also, a light shielding layer 72 is provided to prevent incident light from entering the peripheral circuits. A passivation layer 74 for protection is further provided on the light shielding layer 72.

The second embodiment differs from the first embodiment in that the readout circuit that reads signal electrons is provided on the light incidence side of the semiconductor substrate 10. A transfer transistor 40, a floating diffusion layer 42, and a transistor group 44 including an amplification transistor, a reset transistor, and an address transistor are provided in this readout circuit for each unit pixel, as in the first embodiment.

An optical waveguide structure 60 that is wider on the light incidence side may be provided in a multilayer interconnect layer 48 formed on the incidence side. An insulating buried region 62 is formed in the optical waveguide structure 60. To transmit light in the optical waveguide structure 60, the refractive index of the insulating buried region 62 is preferably higher than the refractive index of the material of the interlayer insulating layer 46 between the interconnect layers of the multilayer interconnect layer 48. A fixed charge layer 28a that holds negative fixed charges is also provided at the bottom portion of the optical waveguide structure 60. The negative charges of the fixed charge layer 28a interpose the interlayer insulating layer 46, and a hole storage layer 25 is provided on the n-type diffusion layer 24 made of silicon at the lower portion.

In this second embodiment, only the fixed charge layer 28a is provided as an antireflection structure. The fixed charge layer 28a is formed to cover the n-type diffusion layer 24 of the pn photodiode (the photoelectric converting unit). Since the multilayer interconnect 48 is provided in the region of the semiconductor substrate 10 excluding the regions in which the n-type diffusion layers 24 of the respective pixels 22 are provided, or in the p-type region 26 and the pixel separation region 34, an antireflection structure having the fixed charge layer 28a may not be provided. To function as an antireflection structure, the fixed charge layer 28a should have a layer thickness designed to satisfy the conditions described in the first embodiment. Alternatively, as in the first embodiment, an antireflection structure that has insulating layers above and below the fixed charge layer 28a so as to sandwich the fixed charge layer 28a may be provided.

The peripheral circuit region 70 and the readout circuit that reads signal electrons have substantially the same functions as those of the first embodiment.

In this embodiment, by virtue of the hole storage region 25, the dark current noise can be effectively reduced by promptly recombining the electrons to be the dark current noise components with the holes of the hole storage region 25, as in the first embodiment.

(Material of the Fixed Charge Film)

Next, the material of the fixed charge layer will be described.

First, as a base material of the fixed charge layer, an oxide dielectric material containing at least one metal among zirconium (Zr), titanium (Ti), and hafnium (Hf) is used. In this example case described below, at least one element selected from the group consisting of W, Mo, Cr, Mn, Fe, Tc, Re, Ru, Os, Rh, Ir, Pd, Pt, Co, and Ni, which have higher valence than the above metals, is introduced as an additive material into the oxide dielectric material.

The method for manufacturing a high-dielectric film that is to be the base material of the fixed charge film and is made of a metal oxide with a high dielectric constant such as a Ti oxide, a Zr oxide, or a Hf oxide may be a typical film formation method at present, such as CVD (Chemical Vapor Deposition), ALD (Atomic Layer Deposition), MBE (Molecular Beam Epitaxy), a sputtering technique, a vapor deposition technique, or a technique by which laser irradiations are combined after forming a layer.

In the high-dielectric film formed by such a manufacturing method, oxygen defects are locally generated. As a result, the high-dielectric layer becomes an n-type semiconductor. In general, when there is a local defect in the tunneling layer through which charges are to tunnel, the charges are lost. To counter this problem, an appropriate amount of a high-valence material described later, or such an amount of a high-valence material as not to form a band, is introduced into the high-dielectric layer. By doing so, a level is formed inside the gap in the high-dielectric layer, and the level serves to trap or pull out electrons. As a level is formed inside the bandgap in the high-dielectric layer, the charges are not lost even if there is a local defect in the high-dielectric layer. Further, even if an oxygen defect is caused in the charge storage region 25 formed by the potential of the fixed charge layer 28a, extra electrons can be pulled into the level inside the bandgap, so that the charges are not lost.

Next, the effectiveness of adding a high-valence material will be described.

Figure 6:
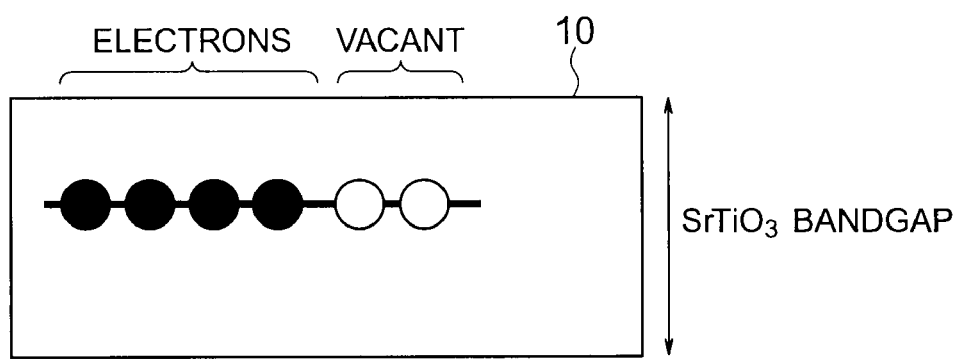
FIG. 6 shows a level that is formed when Ru is added to a $SrTiO_3$ film.

If a low-valence material is added to a high-dielectric material such as a Ti oxide, a Zr oxide, or a Hf oxide of tetravalent, a level is normally not formed inside a bandgap. This is because oxygen defects are formed through a heat treatment (such as annealing) performed during the manufacturing procedures to stabilize the layer structure. The same goes for nitrogen introduction. Since the oxygen defects appear and spread in the vicinity of the conduction band bottom, charges cannot be stored at a high density. Also, in a case where V, Nb, or Ta, which is a pentavalent material having valence that is one higher than tetravalent, is added, a level is formed but appears in the vicinity of the conduction band bottom. As a result, electrons are supplied to the structure, and the high-dielectric layer behaves like an n-type semiconductor. As described above, with the use of this state, charges cannot be stored at a high density.

Where a material of hexavalent or higher valence that is two or more higher than tetravalent is added, the position of the level in a gap formed by the addition of a very small amount shifts into the gap, as indicated by a result of a calculation. In an embodiment, the metal as a base oxide material is at least one of Ti, Zr, and Hf, and this metal is replaced with a high-valence material. According to calculations, when at least one element selected from the group consisting of Tc, Re, Ru, Os, Rh, Ir, Pd, Pt, Co, Ni, W, Mo, Cr, Mn, and Fe is used as an additive material, a level is formed in the bandgap. At this point, electrons exist in some part of the formed level, while electrons are nonexistent in other part of the formed level. FIG. 6 is a schematic view of a situation where Ru is introduced into a $SrTiO_3$ layer. In FIG. 6, the black circles represent the existence of electrons, and the white circles represent the nonexistence of electrons. When electrons are injected into the open level, negative charges are stored. When the existing electrons are pulled out, positive charges are increased compared with the state observed before electrons are pulled out.

An additive material is introduced, instead of the metal (Ti, Zr, or Hf) forming the parent material, so that a vacant state (a state into which electrons can be introduced) is formed in the bandgap. Particularly, in the case of a perovskite structure such as $SrTiO_3$, $SrZrO_3$, $SrHfO_3$, or $Sr(Ti, Zr)O_3$, an additive material is most characteristically introduced into the center position called "B site" of an oxygen octahedral structure. For example, it is extremely important that W or the like is replaced, instead of Ti of $SrTiO_3$. At this point, a localized state in which electrons can be introduced into the gap in $SrTiO_3$ appears.

On the other hand, a situation where existing high-dielectric layers are simply combined, or where $SrTiO_3$ and $WO_3$ are simply mixed, is not considered. With a mixed material of $SrTiO_3$ and $WO_3$, a localized state in which electrons can be introduced into $SrTiO_3$ does not appear. Additive materials can be further limited in terms of stability. For example, it is preferable to use Os, Ru, Ir, or Rh as an additive material.

Next, the optimum amount of an additive material to be added will be described.

First, the lower limit of an additive amount will be described. For example, it has become apparent from calculations that, where the impurity density in the n-type diffusion layer 24 of the photodiode is $1 \times 10^{16}$ $cm^{-3}$, holes are stored on the illuminated side to form the hole storage region 25 when the area density of the fixed charges in the fixed charge layer 28a becomes $1.0 \times 10^{12}$ $C/cm^2$ or higher, or the area density of the amount of the additive element in the fixed charge layer 28a becomes $1.0 \times 10^{12}$ $cm^{-2}$ or higher. Accordingly, interface depletion is prevented, and the dark current is effectively reduced. In this manner, this value can be regarded as the lower limit. When the area density of the additive element in the fixed charge layer 28a is $1.0 \times 10^{12}$ $cm^{-2}$, the density of holes stored in the hole storage region 25 becomes approximately $1.0 \times 10^{17}$ $cm^{-3}$. Where the fixed charge layer 28a has an additive element area density of $1 \times 10^{12}$ $cm^{-2}$ or higher, holes are stored in accordance with the area density of negative fixed charges, and (interface) depletion can be prevented. Accordingly, the upper limit is determined not by the characteristics of the photodiode but by the amount of fixed charges that can be stored in the fixed charge layer.

The upper limit in terms of the physical properties of a high-dielectric layer is set at such an amount that the added material does not form a band in the bandgap of the dielectric material. Where a band is formed, charges are not localized but become conductive. Therefore, when there are defects in the insulating layers 28b and 28c located on both sides of the fixed charge layer 28a, the charges are lost through the defects, and the fixed charge layer 28a stops functioning as a charge fixed layer, resulting in poorer reliability.

A band is normally formed when an additive material or at least one element selected from the group consisting of Tc, Re, Ru, Os, Rh, Ir, Pd, Pt, Co, and Ni is introduced into a 2a×2a×2a unit, with "a" being the lattice constant of the high-dielectric layer. This is because the energy level unique to the element forming an inner bandgap state is different from the energy level unique to the metal element of the parent material, and the interaction with the parent material is not large in the first place. If an additive element is not introduced into a 2a×2a×2a unit structure, on the other hand, a band is not formed. Therefore, the upper limit is $2.0 \times 10^{14}$ $cm^{-2}$, converted into the area density of the additive element. Furthermore, in a case where a material (such as W, Mo, Cr, Mn, or Fe) that is stable as an oxide is added, the charges might spread through the interaction with oxygen. Therefore, there must be only one or less additive material existing in a 2.5a×2.5a×2.5a unit structure. Accordingly, the upper limit in this case is $1.0 \times 10^{14}$ $cm^{-2}$ in the area density of the addictive element.

Also, when charges are introduced, the level tends to become higher, and becomes closer to the level of the parent material. To prevent an interaction through the unique level of the parent material, only one or less additive material should preferably exist in a 3a×3a×3a unit structure. Accordingly, the upper limit of the amount of the additive material to be added in this case is more preferably $0.7 \times 10^{14}$ $cm^{-2}$ in the area density of the additive element.

The following is a description of an example case where at least one element selected from the first additive material group consisting of W, Mo, Cr, Mn, Fe, Tc, Re, Ru, Os, Rh, Ir, Pd, Pt, Co, and Ni, which are materials with higher valence than the metals mentioned below, is introduced as an additive material into an oxide dielectric film containing at least one metal of zirconium (Zr), titanium (Ti), and hafnium (Hf), and at least one element selected from the second additive material group consisting of nitrogen (N), carbon (C), boron (B), Mg, Ca, Sr, Ba, Al, Sc, Y, La, and lanthanoid is further added.

Figure 7:
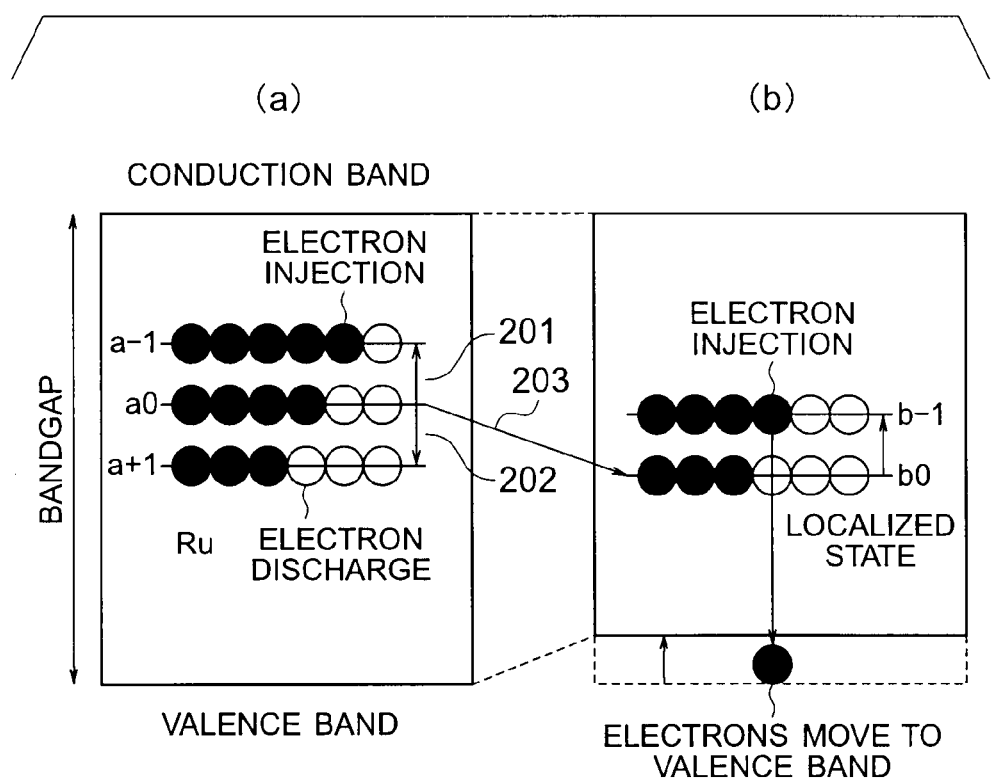
FIGS. 7(a) and 7(b) are schematic views for explaining the levels that are formed when a high-valence material is added to a high-dielectric film.

Here, the features of a level formed in a high-dielectric layer into which an appropriate amount of the first additive material group (high-valence materials) is introduced are explained. The features lie in that a level becomes higher and lower in accordance with the number of electrons in the formed level, as shown in FIG. 7(a). The arrow 201 shown in FIG. 7(a) indicates an upward case, and the arrow 202 indicates a downward case. When electrons are introduced (injected) into a level, the electrons existing in the same level repel one another, and the energy level becomes higher as indicated by the arrow 201 in FIG. 7(a). On the other hand, when electrons are pulled out, the repulsion among electrons becomes smaller, and accordingly, the energy level becomes lower as indicated by the arrow 202 in FIG. 7(a). The level has an extremely large value of approximately 0.3 eV. In other words, when electrons are stored in the level, the level becomes higher as the amount of stored electrons becomes larger.

Here, a first principles calculation is briefly described. A first principles calculation is an electronic state calculation according to the density functional theory with the use of an ultra-softpseudo-potential. The potential of each element (such as titanium or oxygen) is already used in various forms, and is highly reliable. In an embodiment of the present invention, a calculation with extremely high precision is performed. For example, a lattice constant determined through the calculation has an error of 0.6% or less, compared with the experimental value. The precision of lattice constants is normally very important in dielectric material calculations, but this calculation achieves sufficient precision.

In conjunction with (or at the same time as) the introduction of an appropriate amount of the high-valence material into a high-dielectric layer, nitrogen (or carbon, boron, or a low-valence material) is introduced. Through this nitrogen introduction, the electronic state in the level can be controlled, according to the ab initio calculation. In other words, when nitrogen is introduced, the electrons existing in the level formed by the high-valence material introduction can be pulled into the valence band (formed with nitrogen and oxygen), as shown in FIG. 7(b). Through this pulling, the number of electrons in the level decreases, and the energy level becomes lower, according to the ab initio calculation.

The lowering of the energy level is indicated by the arrow 203 shown between FIG. 7(a) and FIG. 7(b). In FIG. 7(b), one electron is pulled into the valence band, and the level becomes lower as the repulsion among electrons becomes smaller.

Figure 8:
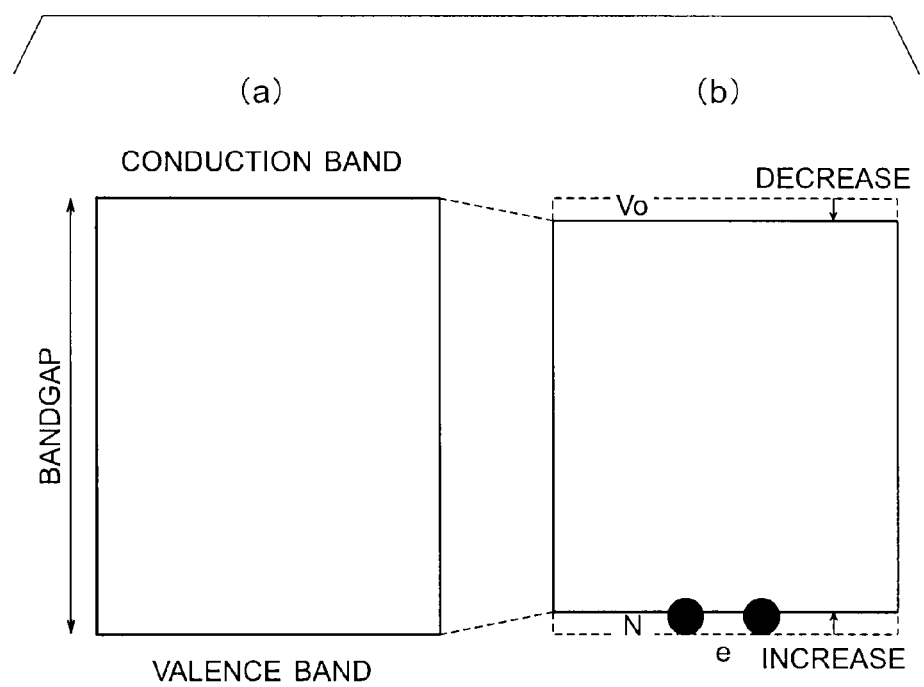
FIGS. 8(a) and 8(b) are schematic views for explaining the levels formed when nitrogen is added to a high-dielectric layer.

Referring now to FIGS. 8(a) and 8(b), the difference from a case where only nitrogen is introduced will be described. In this example case, only nitrogen (N) is introduced into a high-dielectric layer such as a $TiO_2$ film as a fixed charge film. Nitrogen is a material that is negative trivalent, and negative trivalent nitrogen is introduced, instead of oxygen of negative divalent. At this point, for charge compensation, oxygen becomes deficient and stabilized. Accordingly, the oxygen deficit further lowers the bottom of the conduction band, and causes the parent material to behave like an n-type semiconductor, as shown in FIG. 8(b). Due to this behavior, a large amount of charges cannot be stored, and it is difficult to achieve a higher charge density only through nitrogen introduction.

Although an example case where only nitrogen is introduced has been described above, the same situation is observed in a case where only carbon or boron is introduced into the oxygen position or where a low-valence material is introduced into the position of the parent metal (Ti, Zr, Hf). In other words, since oxygen defects appear, a large amount of charges cannot be stored, and it is difficult to achieve a higher charge density.

As in the case where only nitrogen is introduced, a layer having a large amount of oxygen defects is not preferable in terms of reliability. This is because, when charges are injected into a layer having a large amount of oxygen defects, the atomic geometry around the oxygen defects is destroyed. In such a case, the dielectric properties and insulating properties are severely damaged, and therefore, the reliability in charge retention becomes lower.

Further, as in the case where only nitrogen is introduced, a layer having a large amount of oxygen defects is not preferable in terms of leakage properties. This is because crystallization easily occurs in the vicinities of the oxygen defects, as the oxygen defects freely move around in the layer having a large amount of oxygen defects. This crystallization is assumedly caused, since the oxygen defects that move around locally head toward the most stable crystalline structure. As crystals are precipitated, many crystal grain boundaries are formed, and leak paths appear. As a result, the insulating properties are severely degraded.

Next, the optimum additive amount of the second additive material group (nitrogen, carbon, boron, and low-valence materials (Mg, Ca, Sr, Ba, Al, Sc, Y, La, and Ln (lanthanoid)) to be added will be described.

First, the relationship with the total number of electrons will be described. As a high-valence additive material, Tc, Re, Ru, Os, Rh, Ir, Pd, Pt, Co, Ni, W, Mo, Cr, Mn, or Fe is used. When one of those additive materials is introduced, the total number of electrons to be introduced into the level formed in the gap in the charge storage layer is represented by [e]. The total amount of nitrogen, carbon, boron, or a low-valence material to be introduced is represented by [B], and the valence difference is represented by K. For example, the valence difference K is K=1 where the additive material is nitrogen, is K=2 where the additive material is carbon, is K=3 where the additive material is boron, is K=2 where the additive material is a divalent low-valence material, and is K=1 where the additive material is a trivalent low-valence material. Since the number of electrons the nitrogen (carbon, boron, or a low-valence material) can accept is K×[B], the following relationship should preferably be established:

$$0 \leq \{K \times [B]\}/[e] \leq 1.0$$

This is because, when the ratio exceeds 1, oxygen defects are formed according to the exceeding amount. The oxygen defects destroy the parent oxide, and lower the long-term reliability. Because of this problem, the upper limit is set on the amount of nitrogen, carbon, boron, or a low-valence material to be introduced. In other words, if the amount of nitrogen, carbon, boron, or a low-valence material to be introduced is too large compared with the amount of a high-valence material to be introduced, oxygen defects are formed, which is not preferable. Therefore, the preferred range is as follows:

$$0 \leq \{K \times [B]\}/[e] \leq 1.0$$

The above described matter is now described in greater detail, with the additive amount of a high-valence material and the number of electrons to be introduced being separated from each other. The introduction amount of an element selected as a high-valence additive material from the first additive material group consisting of Tc, Re, Ru, Os, Rh, Ir, Pd, Pt, Co, Ni, W, Mo, Cr, Mn, and Fe is represented by [A]. The total introduction amount of an element selected from the second additive material group consisting of nitrogen, carbon, boron, and low-valence materials (Mg, Ca, Sr, Ba, Al, Sc, Y, La, and lanthanoid materials) is represented by [B]. The valence differences K and L are defined as follows: K=1 (in a case where nitrogen is introduced), K=2 (in a case where carbon is introduced), K=3 (in a case where boron is introduced), K=2 (in a case where a divalent low-valence material is introduced), K=1 (in a case where a trivalent low-valence material is introduced). Here, the valence difference K is the number of electron holes formed at the top of the valence band per additive material (or the number of electrons that can be accepted). Accordingly, K×[B] is the number of electrons nitrogen (carbon, boron, or a low-valence material) can accept.

The valence difference L is expressed as: L=the number of high-valence material outermost electrons−4 (high-valence material). For example, where Cr is introduced, L is L=6−4=2, and where Ru is introduced, L is L=8−4=4. The valence difference L is the number of electrons per high-valence material contained in the level in a high-valence material. If the metal of the parent oxide is a tetravalent material, there are extra electrons equivalent to the difference from the tetravalent, and the extra electrons remain in the level. The number of electrons that can be released from the level formed by a high-valence material is represented by L×[A]. Here, the ratio between K×[B] and L×[A] should preferably fall within the range of 0 to 1. This is because, if the ratio exceeds 1, oxygen defects are formed by the amount equivalent to the exceeding amount. The oxygen defects destroy the parent oxide, and lower the long-term reliability. Because of this problem, the upper limit is set on the amount of nitrogen, carbon, boron, or a low-valence material to be introduced. In other words, if the amount of nitrogen, carbon, boron, or a low-valence material to be introduced is too large compared with the amount of a high-valence material to be introduced, oxygen defects are formed, which is not preferable. Therefore, the above ratio should preferably be in the following range:

$$0 \leq \{K \times [B]\}/\{L \times [A]\} \leq 1.0$$

Next, an example case where the material of the fixed charge layer is silicon-rich silicon nitride ($Si_UN$ (U>0.75)) will be described.

A silicon nitride layer as a fixed charge layer is formed by LPCVD, for example. This silicon nitride layer has a higher silicon composition ratio than the silicon composition ratio of a silicon nitride layer that satisfies the stoichiometric proportion. In other words, the silicon nitride layer has a higher composition ratio Si/N than the composition ratio Si/N (3/4=0.75) of a silicon nitride layer $Si_3N_4$ that satisfies the stoichiometric proportion. For example, by making the ratio of a Si raw material gas to a N raw material gas much higher than usual, a silicon-rich silicon nitride layer (a $Si_9N_{10}$ layer, for example) is formed.

An increase in trapped electron density under silicon-rich conditions is caused when the trap level near the lower end of the Si conduction band becomes higher due to dangling bonds of Si atoms that increase with the silicon-rich silicon nitride layer. In a silicon nitride layer (a $Si_3N_4$ layer) that satisfies the stoichiometric proportion, 7.5 Si atoms exist for ten N atoms. However, in a silicon-rich silicon nitride layer (a $Si_9N_{10}$ layer), nine Si atoms exist for ten N atoms. Therefore, 0.079 ((9−7.5)/(9+10)=$_{0.079}$) extra Si atoms exist per atom. N atoms each having three bonds are replaced with the extra Si atoms. Since each Si atom has four bonds, there is one extra bond. Therefore, 0.079 dangling bonds derived from Si atoms are formed per atom. The trapped electron density becomes higher because of the dangling bonds, and charges can be stored.

The fixed charge area density of $1.0 \times 10^{12}$ C/cm$^{-2}$ is the area density at which one trapped electron exists at the center of a 10-nm square where trapped electrons are periodically arranged. In this case, the distance between trapped electrons is longer than 10 nm in the diagonal direction. The area density in a case where one trapped electron exists at the center of a square having a diagonal line of 10 nm (each side being $5 \times 2^{1/2}$ nm) is $2.0 \times 10^{12}$ cm$^{-2}$. Therefore, to prevent degradation of the charge retention properties due to the fixed charge layer turning into a conductive layer, the more preferable lower limit of the Si/N composition ratio is the Si/N composition ratio corresponding to the trapped electron density $n_e=2.0 \times 10^{12}$ cm$^{-2}$. In this case, 0.037, which is the number of Si dangling bonds per atom, and 0.82, which is the corresponding composition ratio Si/N=U, are preferable as lower limit values.

The number of dangling bonds of Si atoms increases as the content rate U of extra Si becomes higher. However, if the content rate U becomes too high, a network of Si—Si bonds is formed. As a result, due to rebonding of the dangling bonds of Si atoms, the number of dangling bonds of Si atoms becomes smaller, and a sufficient effect cannot be obtained.

In the silicon-rich silicon nitride layer $Si_UN$ (U>0.75), the formation of a network of Si—Si rebonding becomes remarkable when U becomes 1/1.1=approximately 0.91 (see J. Robertson, 1994, Phil. Mag. B, vol. 69, p.p. 307-326, for example). When U is equal to 1/1.1, the number of extra Si atoms per atom is expressed as (U−0.75)/(U+1)=$^1$/$_{12}$. In other words, one extra Si atom appears every twelve atoms. More specifically, when U becomes equal to 1/1.1, a network of Si—Si bonds starts being formed, and the number of dangling bonds of Si atoms becomes smaller due to rebonding among Si atoms. Therefore, even if there are many extra Si atoms, the number of dangling bonds of Si atoms does not increase very much. In view of the above, the composition ratio Si/N=U=0.91 is desirable as the upper limit value.

As described above, each embodiment can provide a solid-state imaging device that is capable of reducing dark current without complication.

Furthermore, by virtue of the fixed charge layer, holes are stored at the interface between silicon and the silicon oxide layer, and the dark current generated by the interfacial defect level can be effectively reduced. Also, since the area density of fixed charges can be varied by the amount of additive materials, the necessary amount of fixed charges for forming a sufficient potential to reduce the dark current can be controlled by adjusting the type and amount of the additive element. Furthermore, having an appropriate layer thickness structure, the fixed charge layer can also function as an antireflection layer.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the sprit of the inventions. The accompanying claims and their equivalents are intended to cover such forms or modifications as would fall within the scope and sprit of the invention.

What is claimed is:
1. A solid-state imaging device comprising:
a photoelectric converting unit that includes a semiconductor layer of a second conductivity type provided in a semiconductor substrate of a first conductivity type, converts incident light entering a first surface of the semiconductor substrate into signal charges, and stores the signal charges;
a readout circuit that reads the signal charges stored by the photoelectric converting unit;
an antireflection structure that is provided on the first surface of the semiconductor substrate to cover the semiconductor layer of the photoelectric converting unit, includes a fixed charge film that retains fixed charges being non-signal charges, and prevents reflection of the incident light; and a hole storage region that is provided between the photoelectric converting unit and the antireflection structure, and stores holes being non-signal charges, wherein the fixed charge film includes an oxide dielectric material containing at least one metal of zirconium (Zr) and hafnium (Hf), and contains at least one element selected from the first group consisting of W, Mo, Cr, Mn, Fe, Tc, Re, Ru, Os, Rh, Ir, Pd, Pt, Co, and Ni in the oxide dielectric material, wherein an area density of the selected element in the oxide dielectric material is in the range of $1.0 \times 10^{12}$ cm$^{-2}$ to $2.0 \times 10^{14}$ cm$^{-2}$.

2. The device according to claim 1, wherein the fixed charge film is a silicon-rich silicon nitride film.

3. The device according to claim 1, wherein the antireflection structure further includes first and second insulating films that sandwich the fixed charge film.

4. The device according to claim 1, wherein the readout circuit is provided on the first surface of the semiconductor substrate.

5. A solid-state imaging device comprising:

a photoelectric converting unit that includes a semiconductor layer of a second conductivity type provided in a semiconductor substrate of a first conductivity type, converts incident light entering a first surface of the semiconductor substrate into signal charges, and stores the signal charges;

a readout circuit that reads the signal charges stored by the photoelectric converting unit;

an antireflection structure that is provided on the first surface of the semiconductor substrate to cover the semiconductor layer of the photoelectric converting unit, includes a fixed charge film that retains fixed charges being non-signal charges, and prevents reflection of the incident light; and a hole storage region that is provided between the photoelectric converting unit and the antireflection structure, and stores holes being non-signal charges, wherein the fixed charge film includes an oxide dielectric material containing at least one metal of zirconium (Zr) and hafnium (Hf), and contains at least one element selected from the first group consisting of W, Mo, Cr, Mn, Fe, Tc, Re, Ru, Os, Rh, Ir, Pd, Pt, Co, and Ni in the oxide dielectric material, wherein the fixed charge film further contains at least one element selected from the second group consisting of nitrogen, carbon, boron, Mg, Ca, Sr, Ba, Al, Sc, Y, La, and Ln.

6. A solid-state imaging device comprising:

a photoelectric converting unit that includes a semiconductor layer of a second conductivity type provided in a semiconductor substrate of a first conductivity type, converts incident light entering a first surface of the semiconductor substrate into signal charges, and stores the signal charges;

a readout circuit that reads the signal charges stored by the photoelectric converting unit;

an antireflection structure that is provided on the first surface of the semiconductor substrate to cover the semiconductor layer of the photoelectric converting unit, includes a fixed charge film that retains fixed charges being non-signal charges, and prevents reflection of the incident light; and a hole storage region that is provided between the photoelectric converting unit and the antireflection structure, and stores holes being non-signal charges, wherein the readout circuit is provided on a second surface that is opposite from the first surface of the semiconductor substrate.

7. The device according to claim 6, wherein the fixed charge film includes an oxide dielectric material containing at least one metal of zirconium (Zr), titanium (Ti), and hafnium (Hf), and contains at least one element selected from the first group consisting of W, Mo, Cr, Mn, Fe, Tc, Re, Ru, Os, Rh, Ir, Pd, Pt, Co, and Ni in the oxide dielectric material.

8. The device according to claim 7, wherein an area density of the selected element in the oxide dielectric material is in the range of $1.0 \times 10^{12}$ cm$^{-2}$ to $2.0 \times 10^{14}$ cm$^{-2}$.

9. The device according to claim 7, wherein the fixed charge film further contains at least one element selected from the second group consisting of nitrogen, carbon, boron, Mg, Ca, Sr, Ba, Al, Sc, Y, La, and Ln.

10. The device according to claim 6, wherein the fixed charge film is a silicon-rich silicon nitride film.

11. The device according to claim 6, wherein the antireflection structure further includes first and second insulating films that sandwich the fixed charge film.

* * * * *